(12) United States Patent
Ye et al.

(10) Patent No.: US 11,329,075 B2
(45) Date of Patent: May 10, 2022

(54) METHOD FOR FABRICATING ARRAY SUBSTRATE, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Lulu Ye, Beijing (CN); Lei Yao, Beijing (CN); Kai Zhang, Beijing (CN); Dawei Shi, Beijing (CN); Nana Gao, Beijing (CN); Panpan Zhang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 834 days.

(21) Appl. No.: 16/075,272

(22) PCT Filed: Jan. 4, 2018

(86) PCT No.: PCT/CN2018/070781
§ 371 (c)(1),
(2) Date: Aug. 3, 2018

(87) PCT Pub. No.: WO2018/188388
PCT Pub. Date: Oct. 18, 2018

(65) Prior Publication Data
US 2021/0202543 A1    Jul. 1, 2021

(30) Foreign Application Priority Data

Apr. 12, 2017   (CN) .......................... 201710236527.8

(51) Int. Cl.
*H01L 27/12* (2006.01)

(52) U.S. Cl.
CPC ...... *H01L 27/1262* (2013.01); *H01L 27/1218* (2013.01); *H01L 27/1248* (2013.01); *H01L 27/1288* (2013.01)

(58) Field of Classification Search
CPC ............. H01L 27/1262; H01L 27/1248; H01L 27/1218; H01L 27/1288
(Continued)

(56) References Cited

U.S. PATENT DOCUMENTS

| 2002/0139983 A1 | 10/2002 | Choi et al. |
| 2005/0059192 A1 | 3/2005 | Lin |

(Continued)

FOREIGN PATENT DOCUMENTS

| CN | 102576739 A | 7/2012 |
| CN | 104218094 A | 12/2014 |

(Continued)

OTHER PUBLICATIONS

Search Report and Written Opinion for International Application No. PCT/CN2018/070781 dated Mar. 30, 2018.

(Continued)

*Primary Examiner* — Duy T Nguyen
(74) *Attorney, Agent, or Firm* — Calfee, Halter & Griswold LLP

(57) ABSTRACT

An array substrate, its fabricating method, a display panel and a display device are disclosed. The method includes forming an active layer on a substrate, forming a gate layer on a side of the active layer facing or away from the substrate; forming an interlayer dielectric layer on a side of the active layer away from the substrate, which includes a first, second, third and fourth film stacked in this order in a direction away from the substrate; forming a via hole
(Continued)

extending from the interlayer dielectric layer to the active layer; forming a source and drain layer on a side of the interlayer dielectric layer away from the substrate, and in a region not covered by the source and drain layer, removing the fourth film in the interlayer dielectric layer at a same time as forming the source and drain layer.

13 Claims, 5 Drawing Sheets

(58) Field of Classification Search
USPC .......................................................... 257/79
See application file for complete search history.

(56) References Cited

U.S. PATENT DOCUMENTS

| | | | |
|---|---|---|---|
| 2012/0193624 A1* | 8/2012 | You | H01L 27/1288 257/57 |
| 2012/0242624 A1 | 9/2012 | Tomiyasu et al. | |
| 2013/0221347 A1 | 8/2013 | Isobe et al. | |
| 2016/0187695 A1* | 6/2016 | Cho | H01L 29/78633 349/12 |
| 2016/0254287 A1* | 9/2016 | Wang | H01L 29/4908 257/40 |
| 2017/0186781 A1* | 6/2017 | Noh | H01L 27/1288 |
| 2017/0205953 A1 | 7/2017 | Sun et al. | |
| 2017/0294464 A1* | 10/2017 | Kwon | H01L 27/1225 |
| 2018/0069033 A1 | 3/2018 | Chen | |

FOREIGN PATENT DOCUMENTS

| | | |
|---|---|---|
| CN | 204011436 U | 12/2014 |
| CN | 105629597 A | 6/2016 |
| CN | 105655353 A | 6/2016 |
| CN | 106935546 A | 7/2017 |
| WO | 2016029612 A1 | 3/2016 |

OTHER PUBLICATIONS

First Office Action for Chinese Patent Application No. 201710236527.8 dated Apr. 11, 2018.

* cited by examiner

METHOD FOR FABRICATING ARRAY SUBSTRATE, DISPLAY PANEL AND DISPLAY DEVICE

RELATED APPLICATIONS

The present application is the U.S. national phase entry of PCT/CN2018/070781, with an international filing date of Jan. 4, 2018, which claims the benefit of Chinese Patent Application No. 201710236527.8, filed Apr. 12, 2017, the entire disclosures of which are incorporated herein by reference.

TECHNICAL FIELD

The present disclosure relates to the field of display technologies, and particularly to a method for fabricating an array substrate, an array substrate, a display panel, and a display device.

BACKGROUND

A display device generally includes an array substrate and a color film substrate. An interlayer dielectric layer in the array substrate for the purpose of insulation is arranged between a gate and a source and drain layer. A contact hole is formed by film deposition, activation, hydrogenation, exposure with a mask, dry etching and peeling off, so that a source and drain line can be connected with a polycrystalline silicon layer and transmit electrical signals.

SUMMARY

In some exemplary embodiments of the present disclosure, a method for fabricating an array substrate is provided, including the steps of forming an active layer on a substrate, and forming a gate layer on a side of the active layer facing or away from the substrate. The method further includes forming an interlayer dielectric layer on a side of the active layer away from the substrate, where the interlayer dielectric layer includes a first film, a second film, a third film, and a fourth film which are stacked in this order in a direction away from the substrate. The method further includes forming a photoresist layer on the interlayer dielectric layer; forming a via hole extending from the interlayer dielectric layer to the active layer; and forming a source and drain layer on a side of the interlayer dielectric layer away from the substrate, and in a region not covered by the source and drain layer, removing the fourth film in the interlayer dielectric layer at a same time as forming the source and drain layer.

In some alternative implementations, the first film and the third film include silicon oxide, and the second film and the fourth film include silicon nitride.

In some alternative implementations, the fourth film has a thickness larger than or equal to 20 nm (nanometer) and smaller than or equal to 80 nm.

In some alternative implementations, the first film, the second film and the third film have a thickness larger than or equal to 80 nm and smaller than or equal to 1000 nm.

In some alternative implementations, in the region not covered by the source and drain layer, removing the fourth film in the interlayer dielectric layer at a same time as forming the source and drain layer, includes the steps of etching away the fourth film in the interlayer dielectric layer in the region not covered by the source and drain layer by an etching process, at a same time as forming the source and drain layer.

In some alternative implementations, the gate layer is arranged on a side of the active layer away from the substrate, and the method further includes the steps of forming a light shielding layer between the substrate and the active layer; forming a buffer layer between the light shielding layer and the active layer; forming a gate insulating layer between the active layer and the gate layer; forming a planarization layer on the source and drain layer; forming a first electrode on the planarization layer; forming a passivation layer on the first electrode; forming a contact hole extending from the passivation layer to the source and drain layer; and forming a second electrode on the passivation layer, where the second electrode is connected with the source and drain layer through the contact hole.

In other exemplary embodiments of the present disclosure an array substrate is further provided, including a substrate, an active layer on the substrate, a gate layer on a side of the active layer facing or away from the substrate, an interlayer dielectric layer on a side of the active layer away from the substrate, and a source and drain layer on a side of the interlayer dielectric layer away from the substrate, where the interlayer dielectric layer is provided with a via hole which extends to the active layer, and the source and drain layer is connected with the active layer through the via hole. In a direction from the active layer to the source and drain layer, in a region covered by the source and drain layer, the interlayer dielectric layer includes a first film, a second film, a third film and a fourth film which are stacked in this order. In a region not covered by the source and drain layer, the interlayer dielectric layer includes the first film, the second film, and the third film which are stacked in this order.

In some alternative implementations, the first film and the third film includes silicon oxide, and the second film the fourth film include silicon nitride.

In some alternative implementations, the fourth film has a thickness larger than or equal to 20 nm and smaller than or equal to 80 nm.

In some alternative implementations, the first film, the second film and the third film have a thickness larger than or equal to 80 nm and smaller than or equal to 1000 nm.

In some alternative implementations, the gate layer is arranged on a side of the active layer away from the substrate, and the array substrate further includes a light shielding layer between the substrate and the active layer; a buffer layer between the light shielding layer and the active layer; a gate insulating layer between the active layer and the gate layer; a planarization layer on the source and drain layer; a first electrode on the planarization layer; a passivation layer on the first electrode, where the passivation layer is provided with a contact hole which extends to the source and drain layer; and a second electrode on the passivation layer, where the second electrode is connected with the source and drain layer through the contact hole.

In other exemplary embodiments of the present disclosure, a display panel is further provided, including the array substrate as describe above.

In yet other exemplary embodiments of the present disclosure, a display device is further provided, including the display panel as described above.

DETAILED DESCRIPTION OF EMBODIMENTS

Figure 1:
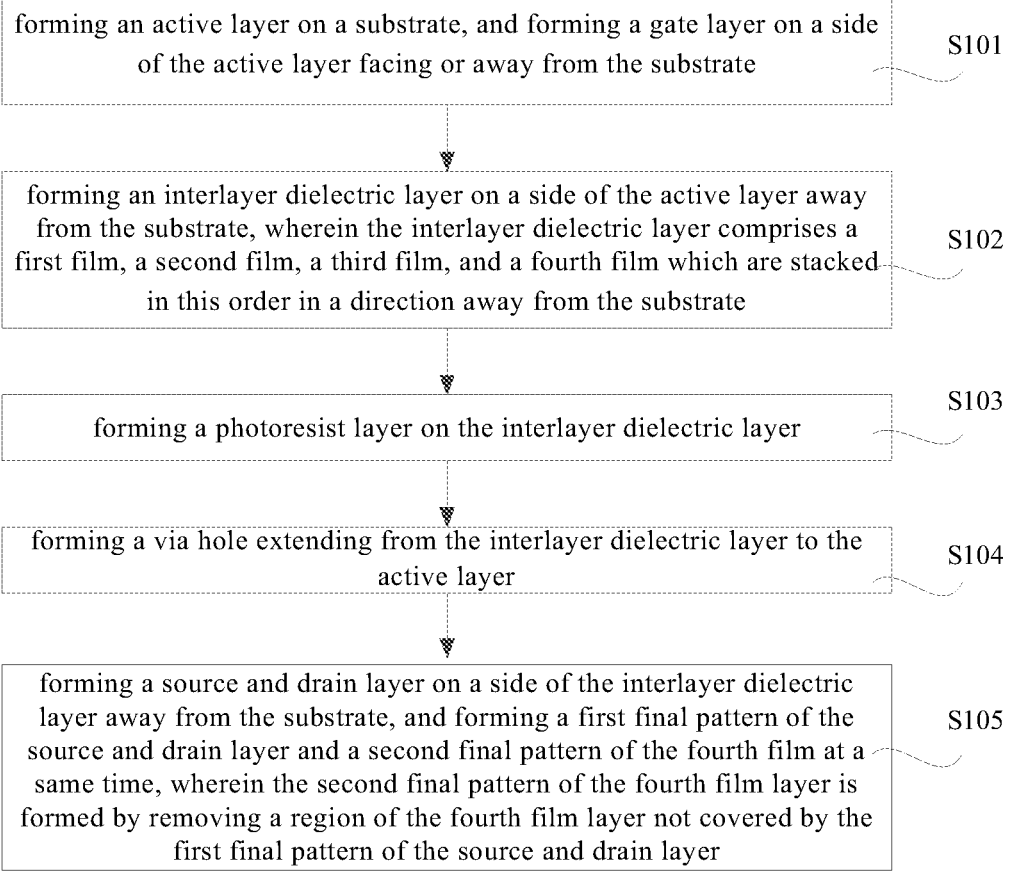
FIG. 1 is a flow chart for illustrating a method for fabricating an array substrate in an embodiment of the present disclosure.

The present disclosure will be described in detail hereinafter with reference to the accompanying drawings and specific implementations, for purpose of better conveying technical solutions of the present disclosure to the skilled in the art.

Reference numerals are: 1—substrate; 2—active layer; 3—interlayer dielectric layer; 31—first film; 32—second film; 33—third film; 34—fourth film; 4—photoresist layer; 5—via hole; 6—source and drain layer; 7—gate layer; 8—light shielding layer; 9—buffer layer; 10—gate insulating layer; 11—planarization layer; 12—first electrode; 13—passivation layer; 14—contact hole; 15—second electrode; and 16—touch electrode.

In a low temperature polycrystalline silicon technique, an interlayer dielectric layer is generally a dual-layer structure including a silicon oxide SiOx layer and a silicon nitride SiNx layer. However, the interlayer dielectric layer of the dual-layer structure suffers from serious color shift at a large viewing angle. In case a three-layer structure including a silicon oxide SiOx layer, a silicon nitride SiNx layer, and a silicon oxide SiOx layer is used, a portion of a silicon oxide SiOx upper layer at the edge of a gate line tends to break under the influences of the shape of the underlying gate line, the difference in stress that silicon nitride SiNx is subject to. In case cracks occur in the interlayer dielectric layer, when the source and drain layer are formed the interlayer dielectric layer, the material for forming the source and drain layer would enter cracks in the interlayer dielectric layer, causing display defect of the display panel. In addition, in the three-layer structure interlayer dielectric layer, the silicon oxide exhibits a poor adhesion for photoresist, so that it is required to coat a photoresist bonding agent prior to coating the photoresist. The photoresist bonding agent tends to cause bright spots and dark spots in the display panel.

As shown in FIG. 1, embodiments of the present disclosure provide a method for fabricating an array substrate, including the following steps.

Figure 2:
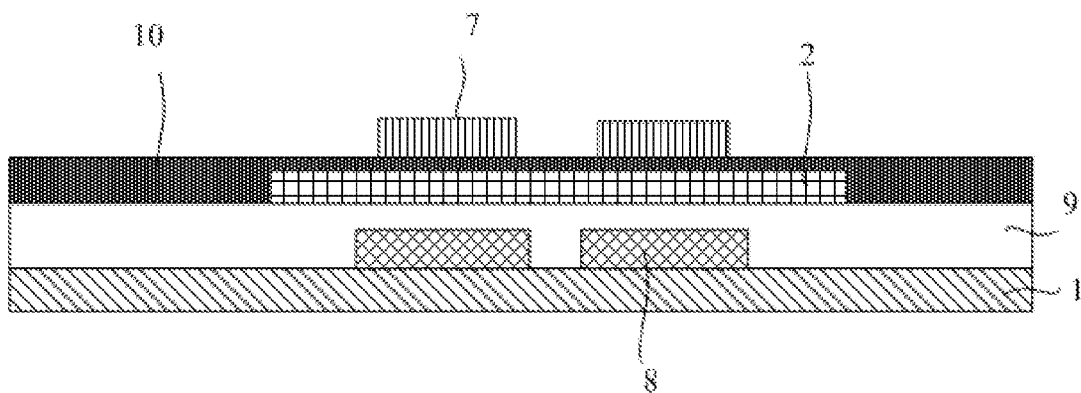
FIG. 2 is a structural view for illustrating a fabricating process of an array substrate in an embodiment of the present disclosure in which a gate layer has been formed.

Step S101 can involve providing a substrate 1, forming an active layer 2 on the substrate 1, forming a gate layer 7 on a side of the active layer 2 facing or away from the substrate 1. By taking a case in which the gate layer is arranged on a side of the active layer away from the substrate as an example, the structure resulting from this step is shown in FIG. 2. Other films like a buffer layer 9 and a light shielding layer 8 can be further arranged between the active layer 2 and the substrate 1.

Figure 3A:
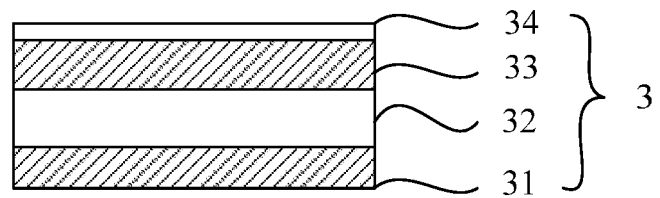
FIGS. 3a, 3b, 3c and 3d are structural views for illustrating a process for forming an interlayer dielectric layer in an embodiment of the present disclosure.

Step S102 can involve forming an interlayer dielectric layer 3 on a side of the active layer 2 away from the substrate 1. In a direction away from the substrate 1, the interlayer dielectric layer 3 as formed includes a first film 31, a second film 32, a third film 33, and a fourth film 34 which are stacked in this order. The first film 31 and the third film 33 are silicon oxide layers, and the second film 32 and the fourth film 34 are silicon nitride layers, as shown in FIG. 3a. For example, each film can be formed by deposition.

Figure 3B:
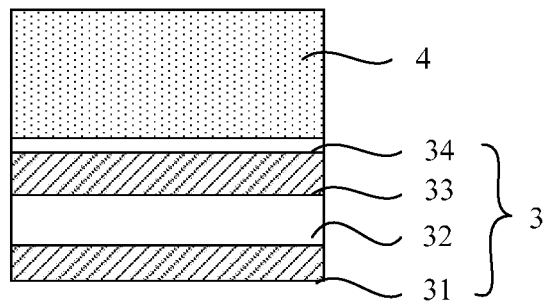

Step S10 can involve forming a photoresist layer 4 on the interlayer dielectric layer 3, as shown in FIG. 3b.

Figure 3C:
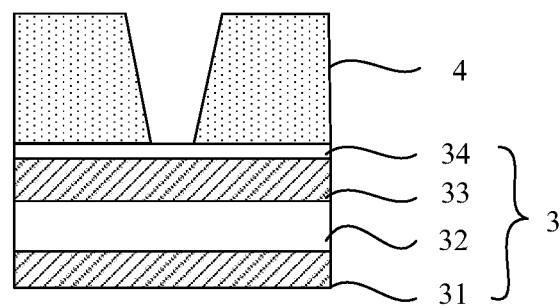
Figure 3D:
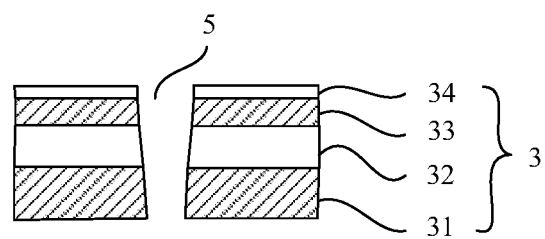
Figure 4:
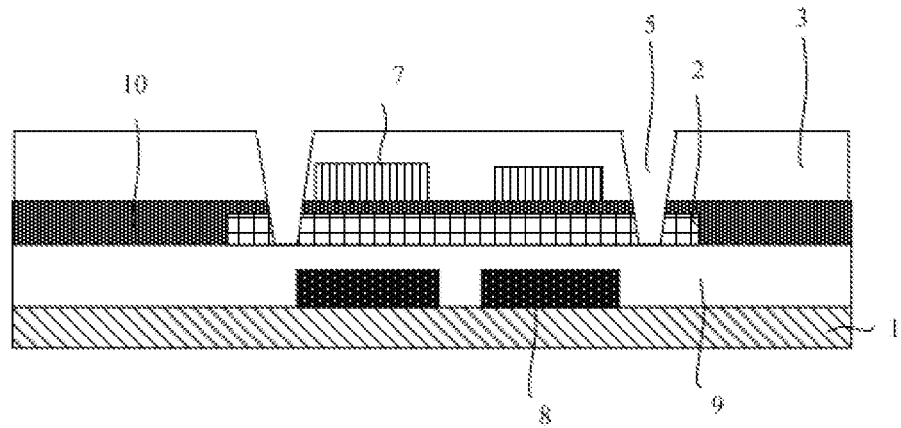
FIG. 4 is a structural view for illustrating a fabricating process of an array substrate in an embodiment of the present disclosure in which an interlayer dielectric layer has been formed.

Step S104 can involve forming a via hole 5 extending from the interlayer dielectric layer 3 to the active layer 2. As shown in FIG. 3c, the interlayer dielectric layer 3 on which the photoresist layer 4 is coated is exposed by means of a mask, a portion of the photoresist to which the via hole 5 to be formed corresponds is removed. As shown in FIG. 3d, the interlayer dielectric layer 3 is etched to form the via hole 5, and the redundant photoresist is removed. The mask for exposure can have a shape as needed. The coated photoresist can be a positive photoresist or a negative photoresist. The structure of array substrate resulting from step S104 is shown in FIG. 4.

Figure 5A:
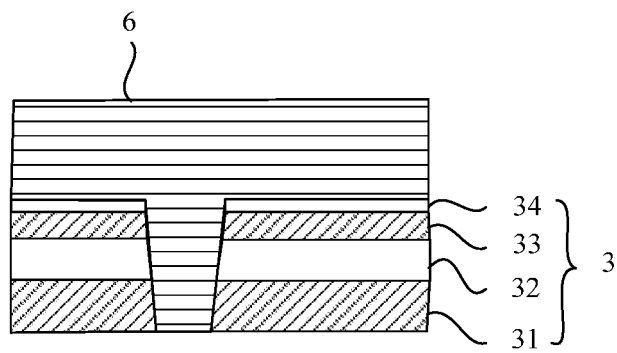
FIGS. 5a, 5b and 5c are structural views for illustrating a process for forming a source and a drain in an embodiment of the present disclosure.
Figure 5B:
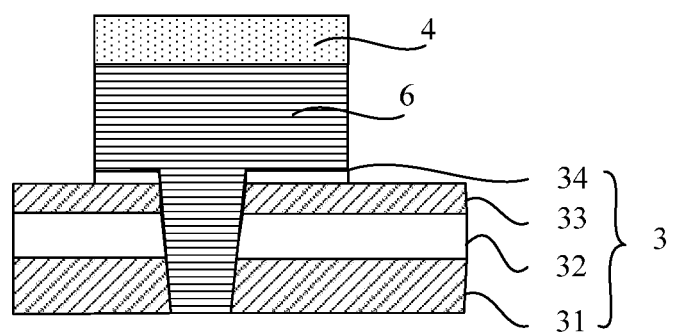
Figure 5C:
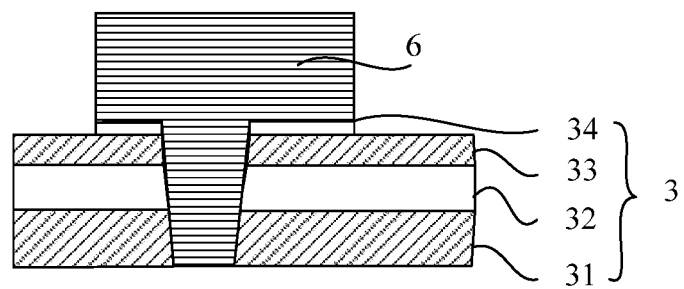
Figure 6:
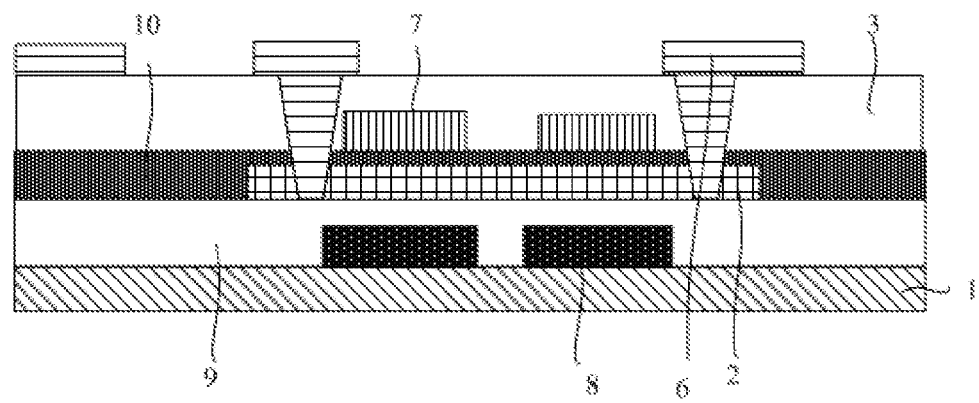
FIG. 6 is a structural view for illustrating a fabricating process of an array substrate in an embodiment of the present disclosure in which a source and a drain have been formed.

Step S105 can involve forming a source and drain layer 6 on a side of the interlayer dielectric layer 3 away from the substrate 1, and removing the fourth film 34 in a portion of the interlayer dielectric layer 3 which is not covered by the source and drain layer 6 at a same time as forming the source and drain layer 6, as shown in FIGS. 5a-5c. By taking a case in which the gate layer is arranged on a side of the active layer away from the substrate as an example, the array substrate resulting from step S105 is shown in FIG. 6.

The active layer can be a polycrystalline silicon layer, or a monocrystalline silicon layer.

Optionally, the fourth film 34 as formed has a thickness larger than or equal to 20 nm and smaller than or equal to 80 nm. This facilitates removing the fourth film 34 by etching when the source and drain layer are formed. For example, the fourth film 34 has a thickness of 20 nm, 30 nm, 45 nm, 50 nm, 60 nm, 70 nm, 80 nm, or the like.

Optionally, the first film 31, the second film 32 and the third film 33 as formed have a thickness larger than or equal to 80 nm and smaller than or equal to 1000 nm. The first film 31, the second film 32 and the third film 33 can have a same thickness, or have different thicknesses. The first film 31, the second film 32, and the third film 33 have a thickness of 80 nm, 150 nm, 300 nm, 500 nm, 600 nm, 850 nm, 900 nm, 1000 nm, or the like. The specific thickness of the first film 31, the second film 32 and the third film 33 can be set as needed by the person with ordinary skill in the art.

In the above step S105, removing the fourth film 34 in the portion of the interlayer dielectric layer 3 which is not covered by the source and drain layer 6 at a same time as forming the source and drain layer 6 includes: etching away the fourth film 34 in the portion of the interlayer dielectric layer 3 which is not covered by the source and drain layer 6, at a same time as forming the source and drain layer 6 by an etching process.

As shown in FIG. 5a, a metal film is coated on the interlayer dielectric layer 3. As shown in FIG. 5b, a photoresist is coated on the metal film in a region where the metal film is retained, and the metal film on which the photoresist is coated is etched to remove the metal film in a region where the metal film is not desired. The etching duration is increased as compared with the common process, to remove the fourth film 34 which is covered by the region where the metal film is not desired. As shown in FIG. 5c, the photoresist on the metal film in the region where the metal film is retained is finally peeled off, to form the source and drain layer 6.

In a specific embodiment of the present disclosure, the gate layer is arranged on a side of the active layer away from the substrate, and the method further includes: forming, e.g. by a film deposition process, the light shielding layer 8 between the substrate 1 and the active layer 2, the buffer layer 9 between the light shielding layer 8 and the active layer 2, and a gate insulating layer 10 between the active layer 2 and the gate layer 7.

Figure 7:
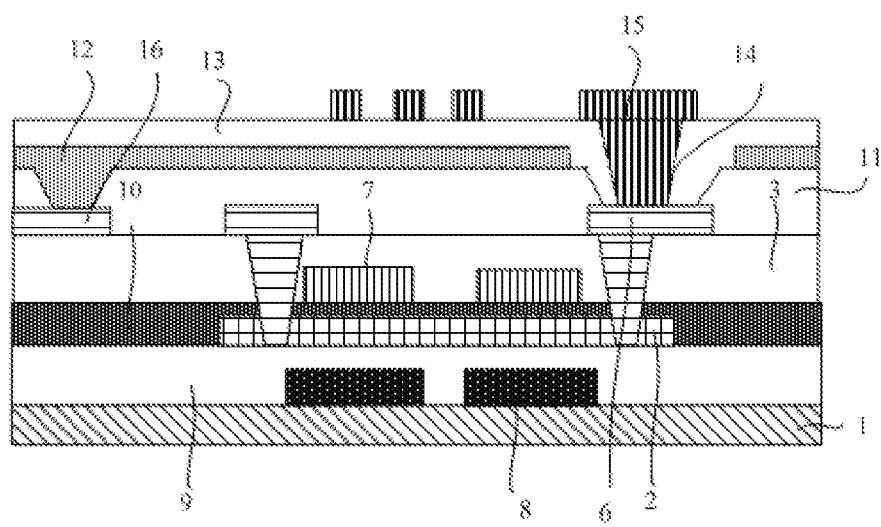
FIG. 7 is a structural view for illustrating an array substrate in an embodiment of the present disclosure.
Figure 8:
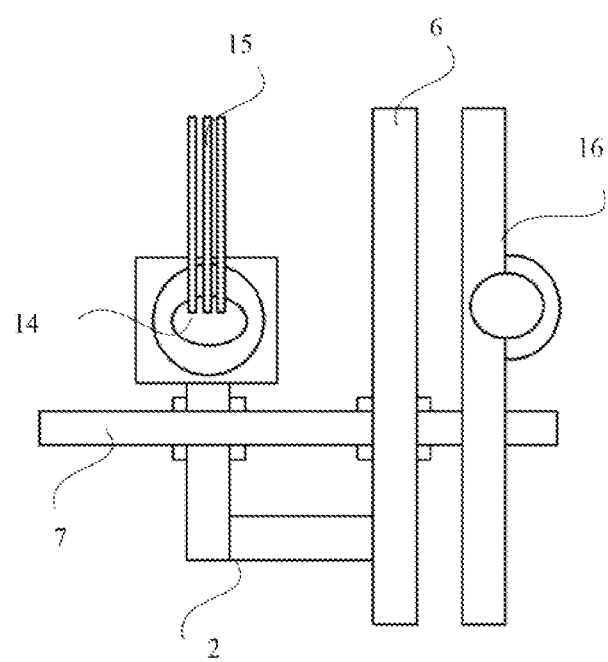
FIG. 8 is another structural view for illustrating an array substrate in an embodiment of the present disclosure.

In an embodiment, the method further includes: forming, e.g. by a film deposition process, a planarization layer 11 on the source and drain layer 6; forming a first electrode 12 on the planarization layer 11; forming, e.g. by a film deposition process, a passivation layer 13 on the first electrode 12; forming, e.g. by exposing with a mask, etching or the like, a contact hole 14 extending from the passivation layer 13 to the source and drain layer 6; and forming a second electrode 15 on the passivation layer 13, where the second electrode 15 is connect with the source and drain layer 6 through the contact hole 14. The structure of the resulting array substrate is shown in FIG. 7 and FIG. 8.

For example, the first electrode can be a common electrode, and the second electrode can be a pixel electrode.

In another specific embodiment of the present disclosure, the gate layer is arranged on a side of the active layer facing the substrate, and the method for fabricating an array substrate further includes:

forming, e.g. by a film deposition process, the gate insulating layer between the active layer and the gate layer;

forming, e.g. by a film deposition process, the planarization layer on the source and drain layer.

forming the first electrode on the planarization layer;

forming, e.g. by a film deposition process, the passivation layer on the first electrode;

forming, e.g. by exposing with a mask, etching or the like, the contact hole extending from the passivation layer to the source and drain layer; and forming the second electrode on the passivation layer, where the second electrode is connected with the source and drain layer through the contact hole.

For example, the first electrode is a common electrode, and the second electrode is a pixel electrode. In the array substrate of this structure, the light shielding layer and the buffer layer can also be arranged between the gate layer and the substrate.

Embodiments of the present disclosure further provide an array substrate, including: a substrate, an active layer on the substrate, a gate layer on a side of the active layer facing or away from the substrate, an interlayer dielectric layer on a side of the active layer away from the substrate, and a source and drain layer on a side of the interlayer dielectric layer away from the substrate, where the interlayer dielectric layer is provided with a via hole which extends to the active layer, and the source and drain layer is connected with the active layer through the via hole;

in a direction from the active layer to the source and drain layer, in a region covered by the source and drain layer, the interlayer dielectric layer includes the first film, the second film, the third film and the fourth film which are stacked in this order, and in a region not covered by the source and drain layer, the interlayer dielectric layer includes the first film, the second film, and the third film which are stacked in this order, wherein the first film and the third film include silicon oxide, and the second film and the fourth film include silicon nitride.

By taking a case in which the gate layer is arranged on a side of the active layer away from the substrate as an example, as shown in FIG. 5c and FIG. 7, embodiments the present disclosure further provide an array substrate, including the substrate 1, the active layer 2 on the substrate 1, the gate layer 7 on a side of the active layer 2 away from the substrate 1, the interlayer dielectric layer 3 on a side of the gate layer 7 away from the substrate 1, and the source and drain layer 6 on a side of the interlayer dielectric layer 3 away from the substrate 1. The interlayer dielectric layer 3 is provided with the via hole 5 which extends to the active layer 2, and the source and drain layer 6 is connected with the active layer 2 through the via hole 5.

In a direction from the active layer 2 to the source and drain layer, in a region covered by the source and drain layer 6, the interlayer dielectric layer 3 includes the first film 31, the second film 32, the third film 33 and the fourth film 34 which are stacked in this order, and in a region not covered by the source and drain layer, the interlayer dielectric layer 4 includes the first film 31, the second film 32, and the third film 33 which are stacked in this order, where the first film 31 and the third film 33 include silicon oxide, and the second film 32 and the fourth film 34 include silicon nitride.

According to the array substrate of the present disclosure, the interlayer dielectric layer between the gate and the source and drain layer is formed by four layers. This can avoid the need of additionally coating a photoresist bonding agent due to the poor adhesion between the top silicon oxide layer in the existing three-layer structure and the photoresist. This can save cost, and reduce bright spots and dark spots due to coating of the photoresist bonding agent. Furthermore, in a region not covered by the source and drain layer, the fourth film (of silicon nitride) in the interlayer dielectric layer is etched away in the etching process for forming the source and drain layer. As a result, in the region not covered by the source and drain layer, the interlayer dielectric layer 3 still includes three layers (a silicon oxide layer, a silicon nitride layer, and a silicon oxide layer). This will not cause chromatic aberration of the display device at a large viewing angle.

Thus, according to the method for fabricating an array substrate of the present disclosure, color shift at a large viewing angle is avoided, bright spots and dark spots are reduced, and the display effect of display device is improved.

The active layer can be a polycrystalline silicon layer or a monocrystalline silicon layer.

Optionally, the fourth film 34 has a thickness larger than or equal to 20 nm and smaller than or equal to 80 nm. In this way, the fourth film 34 can be removed by etching during forming the source and drain layer. For example, the fourth film 34 has a thickness of 20 nm, 30 nm, 45 nm, 50 nm, 60 nm, 70 nm, 80 nm, or the like.

Optionally, the first film 31, the second film 32 and the third film 33 has a thickness larger than or equal to 80 nm and smaller than or equal to 1000 nm. The first film 31, the second film 32 and the third film 33 can have an identical thickness, or different thicknesses. The first film 31, the second film 32, and the third film 33 have a thickness of 80 nm, 150 nm, 300 nm, 500 nm, 600 nm, 850 nm, 900 nm, 1000 nm, or the like. The specific thickness of the first film 31, the second film 32 and the third film 33 can be set as needed by the person with ordinary skill in the art.

As shown in FIG. 7, in a specific embodiment, the gate layer is arranged on a side of the active layer away from the substrate, and the array substrate further includes:

the light shielding layer 8 between the substrate 1 and the active layer 2;

the buffer layer 9 between the light shielding layer 8 and the active layer 2;

the gate insulating layer 10 between the active layer 2 and the gate layer 7;

the planarization layer 11 on the source and drain layer 6;

the first electrode 12 on the planarization layer 11;

the passivation layer 13 on the first electrode 12, where the passivation layer 13 is provided with the contact hole 14 which extends to the source and drain layer 6; and the second electrode 15 on the passivation layer 13, where the second electrode 15 is connected with the source and drain layer 6 through the contact hole 14.

In another specific embodiment, the gate layer is arranged on a side of the active layer facing the substrate, and the array substrate further includes:

the gate insulating layer between the active layer and the gate layer;

the planarization layer on the source and drain layer;

the first electrode on the planarization layer;

the passivation layer on the first electrode, where the passivation layer is provided with the contact hole which extends to the source and drain layer; and a second electrode on the passivation layer, where the second electrode is connected with the source and drain layer through the contact hole. In the array substrate of this structure, the light shielding layer and the buffer layer can further be arranged between the gate layer and the substrate.

Embodiments of the present disclosure further provide a display panel, including the array substrate as described above. According to the array substrate of the present disclosure, color shift at a large viewing angle is avoided, bright spots and dark spots are reduced, and the display effect of display device is improved.

The display panel can be a touch panel, which can be an In-Cell touch panel. A touch electrode in the In-Cell touch panel can be formed at a same time as the source and drain electrode.

Embodiments of the present disclosure further provide a display device, including the display panel as described above. The display device has improved display effect.

In embodiments of the present disclosure, the display device can be any one of a mobile phone, a tablet computer, electronic paper, a digital photo frame.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for fabricating an array substrate, comprising: forming an active layer on a substrate, and forming a gate layer on a side of the active layer facing or away from the substrate, wherein the method further comprises:

forming an interlayer dielectric layer on a side of the active layer away from the substrate, wherein the interlayer dielectric layer is an insulating layer and the interlayer dielectric layer comprises a first film, a second film, a third film, and a fourth film which are stacked in this order in a direction away from the substrate;

forming a via hole extending from the interlayer dielectric layer to the active layer; and forming a source and drain layer on a side of the interlayer dielectric layer away from the substrate, and forming a first final pattern of the source and drain layer and a second final pattern of the fourth film at a same time, wherein the second final pattern of the fourth film layer is formed by removing a region of the fourth film layer not covered by the first final pattern of the source and drain layer.

2. The method of claim 1, wherein the first film and the third film comprise silicon oxide, and the second film and the fourth film comprise silicon nitride.

3. The method of claim 2, wherein the gate layer is arranged on a side of the active layer away from the substrate, and the method further comprises:

forming a light shielding layer between the substrate and the active layer;

forming a buffer layer between the light shielding layer and the active layer;

forming a gate insulating layer between the active layer and the gate layer;

forming a planarization layer on the first final pattern of the source and drain layer;

forming a first electrode on the planarization layer;

forming a passivation layer on the first electrode;

forming a contact hole extending from the passivation layer to the first final pattern of the source and drain layer; and forming a second electrode on the passivation layer, wherein the second electrode is connected with the first final pattern of the source and drain layer through the contact hole.

4. The method of claim 1, wherein the fourth film has a thickness larger than or equal to 20 nm and smaller than or equal to 80 nm.

5. The method of claim 4, wherein the gate layer is arranged on a side of the active layer away from the substrate, and the method further comprises:

forming a light shielding layer between the substrate and the active layer;

forming a buffer layer between the light shielding layer and the active layer;

forming a gate insulating layer between the active layer and the gate layer;

forming a planarization layer on the first final pattern of the source and drain layer;

forming a first electrode on the planarization layer;

forming a passivation layer on the first electrode;

forming a contact hole extending from the passivation layer to the first final pattern of the source and drain layer; and forming a second electrode on the passivation layer, wherein the second electrode is connected with the first final pattern of the source and drain layer through the contact hole.

6. The method of claim 1, wherein the first film, the second film and the third film have a thickness larger than or equal to 80 nm and smaller than or equal to 1000 nm.

7. The method of claim 6, wherein the gate layer is arranged on a side of the active layer away from the substrate, and the method further comprises:

forming a light shielding layer between the substrate and the active layer;

forming a buffer layer between the light shielding layer and the active layer;

forming a gate insulating layer between the active layer and the gate layer;

forming a planarization layer on the first final pattern of the source and drain layer;

forming a first electrode on the planarization layer;

forming a passivation layer on the first electrode;

forming a contact hole extending from the passivation layer to the first final pattern of the source and drain layer; and forming a second electrode on the passivation layer, wherein the second electrode is connected with the first final pattern of the source and drain layer through the contact hole.

8. The method of claim 1, wherein forming the first final pattern of the source and drain layer, and the second final pattern of the fourth film at the same time comprises:

etching away the region of the fourth film not covered by the first final pattern of the source and drain layer by an etching process, at the same time as forming the first final pattern of the source and drain layer.

9. The method of claim 8, wherein the gate layer is arranged on a side of the active layer away from the substrate, and the method further comprises:

forming a light shielding layer between the substrate and the active layer;

forming a buffer layer between the light shielding layer and the active layer;

forming a gate insulating layer between the active layer and the gate layer;

forming a planarization layer on the first final pattern of the source and drain layer;

forming a first electrode on the planarization layer;

forming a passivation layer on the first electrode;

forming a contact hole extending from the passivation layer to the first final pattern of the source and drain layer; and forming a second electrode on the passivation layer, wherein the second electrode is connected with the first final pattern of the source and drain layer through the contact hole.

10. The method of claim 1, wherein the gate layer is arranged on a side of the active layer away from the substrate, and the method further comprises:

forming a light shielding layer between the substrate and the active layer;

forming a buffer layer between the light shielding layer and the active layer;

forming a gate insulating layer between the active layer and the gate layer;

forming a planarization layer on the first final pattern of the source and drain layer;

forming a first electrode on the planarization layer;

forming a passivation layer on the first electrode;

forming a contact hole extending from the passivation layer to the first final pattern of the source and drain layer; and forming a second electrode on the passivation layer, wherein the second electrode is connected with the first final pattern of the source and drain layer through the contact hole.

11. A display panel, comprising the array substrate of claim 1.

12. A display device, comprising the display panel of claim 11.

13. The method of claim 1, wherein forming the via hole extending from the interlayer dielectric layer to the active layer comprises:

coating a photoresist layer on the interlayer dielectric layer;

exposing the interlayer dielectric layer on which the photoresist layer is coated by means of a mask to remove a portion of the photoresist to which the via hole to be formed corresponds; and etching the interlayer dielectric layer to form the via hole.

* * * * *